United States Patent
Liu et al.

(10) Patent No.: US 9,449,942 B1
(45) Date of Patent: Sep. 20, 2016

(54) METHOD OF MAKING RFID DEVICES ON FABRICS BY STITCHING METAL WIRES

(71) Applicant: Flextronics AP, LLC, San Jose, CA (US)

(72) Inventors: Weifeng Liu, Dublin, CA (US); Murad Kurwa, San Jose, CA (US); Anwar Mohammed, San Jose, CA (US); Zhen Feng, San Jose, CA (US)

(73) Assignee: Flextronics AP, LLC, San Jose, CA (US)

( * ) Notice: Subject to any disclaimer, the term of this patent is extended or adjusted under 35 U.S.C. 154(b) by 0 days.

(21) Appl. No.: 14/803,803

(22) Filed: Jul. 20, 2015

(51) Int. Cl.
    *H01L 23/00* (2006.01)
    *H01L 21/56* (2006.01)
    *H01L 21/28* (2006.01)

(52) U.S. Cl.
    CPC ............... *H01L 24/83* (2013.01); *H01L 21/28* (2013.01); *H01L 21/56* (2013.01); *H01L 24/42* (2013.01); *H01L 2924/151* (2013.01)

(58) Field of Classification Search
    CPC ....... H01L 23/18; H01L 23/49; H01L 24/46; H01L 51/10
    See application file for complete search history.

(56) References Cited

U.S. PATENT DOCUMENTS

2014/0209690 A1*  7/2014  Teng ................ G06K 19/027
                                          235/492

* cited by examiner

*Primary Examiner* — Cheung Lee
(74) *Attorney, Agent, or Firm* — Volpe and Koenig, P.C.

(57) ABSTRACT

A method for making a Radio Frequency Identification (RFID) device on fabric is described herein. In a first example, an RFID semiconductor chip is attached to a piece of fabric. The RFID semiconductor chip includes two terminals. A solid wire is stitched into the fabric making an RFID antenna. The solid wire is attached to the terminals of the RFID semiconductor chip. In a second example, a metal wire is selected. The metal wire is stitched into fabric making an RFID antenna. The metal wire includes two ends and a conductive adhesive is applied to two ends of the metal wire. An RFID semiconductor chip is attached to the fabric. The RFID semiconductor chip includes two terminals and the RFID semiconductor chip is attached to the fabric at the two terminals. The conductive adhesive is cured. In both examples, the wire and the RFID semiconductor chip are encapsulated in fabric.

16 Claims, 4 Drawing Sheets

| 601 | Selecting a metal wire for the RFID antenna |

| 602 | Stitching the metal wire to a piece of cloth to make the RFID antenna |

| 603 | Stripping the insulation at the two ends of the metal wire |

| 604 | Applying a conductive adhesive at the two ends of the metal wire |

| 605 | Attaching an RFID semiconductor chip to the cloth at the two ends of the metal wire |

| 606 | Curing the conductive adhesive to establish a connection between the RFID antenna and RFID semiconductor chip |

| 607 | Encapsulating the metal wire and RFID semiconductor chip |

FIGURE 6

METHOD OF MAKING RFID DEVICES ON FABRICS BY STITCHING METAL WIRES

FIELD OF INVENTION

Embodiments of the present disclosure generally relate to an electronic module assembled to a conductive fabric, and a method of assembling an electronic module to a conductive fabric.

BACKGROUND

In some applications, it may be desirable to form an assembly of an electronic module on a conductive fabric to form an integrated system. Conventional assemblies use printed ink to make a Radio Frequency Identification (RFID) antenna. Using the printed ink on fabric creates a high electrical resistance, which in turn result in poor performance. Additionally, using the traditional plating and etching process to make the RFID antenna may not be compatible with textile and wearable applications.

Accordingly, a need exists for a convenient disconnectable connection of electronic devices to fabrics.

SUMMARY

A method for making a Radio Frequency Identification (RFID) device on fabric is described herein. In a first example, an RFID semiconductor chip is attached to a piece of fabric. The RFID semiconductor chip includes two terminals. A solid wire is stitched into the fabric making an RFID antenna. The solid wire is attached to the terminals of the RFID semiconductor chip. In a second example, a metal wire is selected. The metal wire is stitched into fabric making an RFID antenna. The metal wire includes two ends and a conductive adhesive is applied to two ends of the metal wire. An RFID semiconductor chip is attached to the fabric. The RFID semiconductor chip includes two terminals and the RFID semiconductor chip is attached to the fabric at the two terminals. The conductive adhesive is cured. In both examples, the wire and the RFID semiconductor chip are encapsulated in fabric.

BRIEF DESCRIPTION OF THE DRAWING(S)

FIG. 6 is an example method of a second embodiment for attaching an RFID device on fabric.

DETAILED DESCRIPTION OF THE PREFERRED EMBODIMENT(S)

A method for making Radio Frequency Identification (RFID) devices by stitching solid metal wire into fabrics as an RFID antenna and attaching a semiconductor chip to the wire is described herein. This method provides an easy and convenient way to make RFID devices (passive) and cost effective. This method allows for suitable high volume production. A solid wire may provide for better electrical conductivity than printed inks, resulting in a much better performance of the RFID. By stitching the solid metal wire into fabrics, the RFID may be integrated into clothes. Additionally, the RFID is non-removable.

The wire used to make the RFID antenna may be insulated, for example, a magnet wire, or non-insulated. The wire may be pure metal, for example, silver, copper, aluminum, or the like, and their alloys, for example, steel. The wire may be stitched into the fabric using an automatic sewing machine. The semiconductor chip may be connected to the wire using several different methods, for example, soldering, welding, conductive adhesive, and the like.

Figure 1:
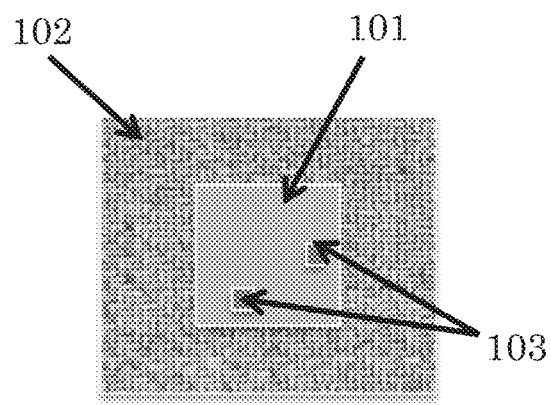
FIG. 1 is an example of an RFID semiconductor chip attached to fabric.
Figure 2:
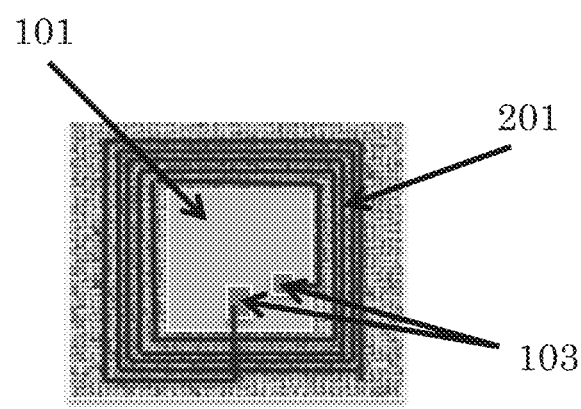
FIG. 2 is an example of the stitching used for the RFID antenna.

FIGS. 1 and 2 are an example of a first embodiment of an RFID device on fabric. FIG. 1 is an example of an RFID semiconductor chip attached to fabric. The RFID semiconductor chip 101 is attached to the fabric 102 using a die attach material, for example, using an epoxy based adhesive, a silicone based adhesive, or the like. The RFID semiconductor chip 101 may include terminals 103 for connecting a wire to the RFID semiconductor chip 101.

FIG. 2 is an example of the stitching used for the RFID antenna. A piece of solid wire 201 is stitched on the fabric 102 to create an RFID antenna. The sewing may be done, for example, using a sewing machine. The solid wire 201 may be, for example, an insulated wire magnet that is capable of being soldered. After the solid wire 201 is attached to the fabric, a laser soldering machine may be used to solder the solid wire 201 to the terminals 103 of the RFID semiconductor chip 101. Once the solid wire 201 is connected to the RFID semiconductor chip 101, the entire thing is encapsulated in fabric (not shown). To encapsulate the RFID semiconductor chip 101, a piece of fabric may be sewn overtop to prevent outside elements from interfering with the RFID semiconductor chip. Additionally, the fabric may need to be heat sealed at the edges to prevent water from getting in.

Figure 3:
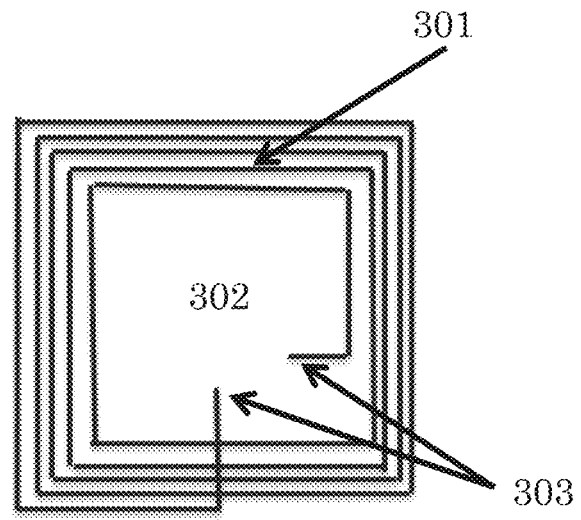
FIG. 3 is an example of a design pattern of a wire stitched into cloth.
Figure 4:
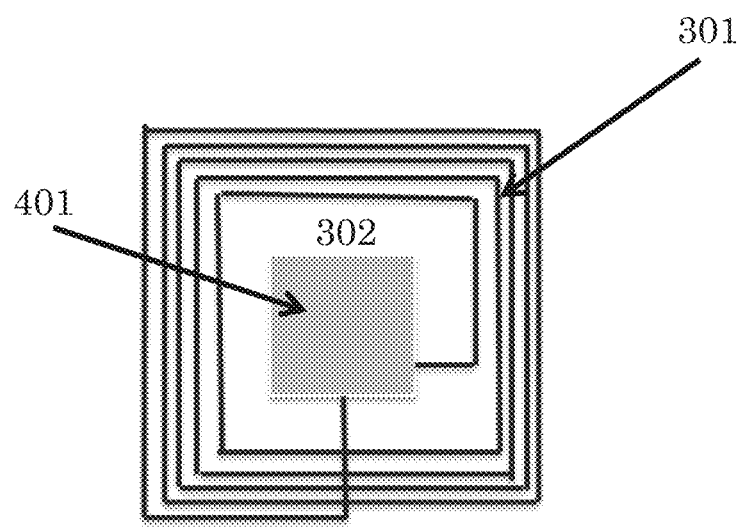
FIG. 4 is an example of the RFID semiconductor chip attached to the metal wire.

FIGS. 3 and 4 are examples of a second embodiment of an RFID device on fabric. FIG. 3 is an example of a design pattern of a wire stitched into cloth. In FIG. 3 a magnet wire 301 is selected, for example an insulated copper wire. The metal wire 301 may be stitched into a cloth 302 based on a design pattern to make an RFID antenna. A laser may be used to strip the insulation materials at the two ends 303 of the magnet wire 301, exposing the metals. A conductive adhesive may be applied to the two ends 303 of the magnet wire 301. For example, a conductive adhesive may be silver, copper, or nickel based embedded in polymers, such as, silicone, epoxy, acrylic, and the like. Additionally, a conductive tape or film may be used to attach the two ends 303 of the magnet wire 301. If a conductive tape or film is used, it will need to be cured at an appropriate temperature and pressure.

FIG. 4 is an example of the RFID semiconductor chip attached to the metal wire. The RFID semiconductor chip 401 may be attached to the cloth 302 at the chip terminals (not shown) which correspond to the two ends 303 of the magnet wire 301. The conductive adhesive, previously applied to the two ends 303 of the magnet wire 301, is the cured to establish the connection between the RFID antenna and the RFID semiconductor chip 401. Once the RFID antenna (magnet wire) 301 is connected to the RFID semiconductor chip 401, the entire thing is encapsulated in fabric (not shown).

Figure 5:
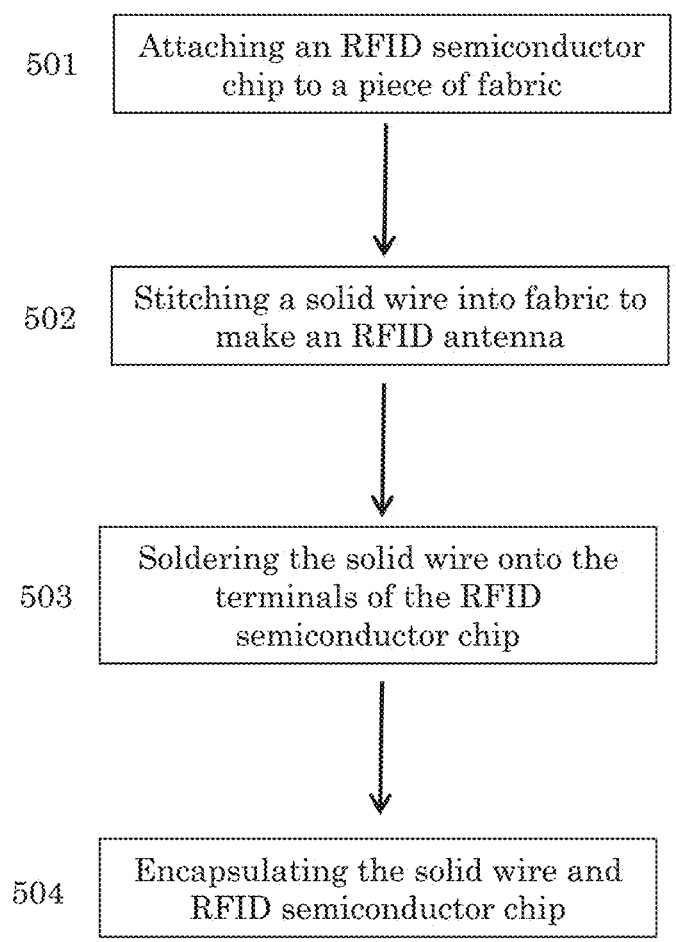
FIG. 5 is an example method of a first embodiment for attaching an RFID device on fabric.

FIG. 5 is an example method of a first embodiment for attaching an RFID device on fabric. An RFID semiconductor chip may be attached to a piece of fabric using a die attach material 501. For example, the die attach material may be an epoxy adhesive. A solid wire may then be stitched into the fabric to make an RFID antenna 502, for example, using a sewing machine. The solid wire is then soldered onto the terminal of the RFID semiconductor chip 503 using a laser soldering machine. The solid wire and the RFID semiconductor chip may then be encapsulated 504.

FIG. 6 is an example method of a second embodiment for attaching an RFID device on fabric. A magnet wire, for example, an insulated copper wire, is selected 601 and stitched into a piece of cloth to make an RFID antenna 602. The magnet wire is stitched into the fabric based on a design pattern. A laser may then be used to strip the insulation materials at the two ends of the magnet wire to expose the metal 603. A conductive adhesive may then be applied at the two ends of the magnet wire 604. An RFID semiconductor chip may be attached to the piece of cloth at the chip terminals 605, which correspond to the two ends of the magnet wire. The conductive adhesive is then cured to establish a connection between the RFID antenna and the RFID semiconductor chip 606. The RFID antenna and the RFID semiconductor chip may then be encapsulated 607.

Having thus described the present invention in detail, it is to be appreciated and will be apparent to those skilled in the art that many physical changes, only a few of which are exemplified in the detailed description of the invention, could be made without altering the inventive concepts and principles embodied therein. It is also to be appreciated that numerous embodiments incorporating only part of the preferred embodiment are possible which do not alter, with respect to those parts, the inventive concepts and principles embodied therein. The present embodiment and optional configurations are therefore to be considered in all respects as exemplary and/or illustrative and not restrictive, the scope of the invention being indicated by the appended claims rather than by the foregoing description, and all alternate embodiments and changes to this embodiment which come within the meaning and range of equivalency of said claims are therefore to be embraced therein.

What is claimed is:

1. A method for making a Radio Frequency Identification (RFID) device on fabric, the method comprising:
    attaching an RFID semiconductor chip to a piece of fabric, wherein the RFID semiconductor chip includes at least two terminals;
    stitching a solid wire into the fabric to make an RFID antenna;
    attaching the solid wire to the at least two terminals of the RFID semiconductor chip; and
    encapsulating the solid wire and the RFID semiconductor chip.

2. The method of claim 1, wherein the RFID semiconductor chip is attached to the fabric using an epoxy based adhesive.

3. The method of claim 1, wherein the solid wire is an insulated wire.

4. The method of claim 3, wherein the insulated wire is at least one of silver, copper, and aluminum.

5. The method of claim 1, wherein the solid wire is a non-insulated wire.

6. The method of claim 1, wherein the solid wire is stitched into the fabric in a design pattern.

7. The method of claim 1 wherein the solid wire is attached to the RFID semiconductor chip by soldering.

8. The method of claim 1, wherein the solid wire is attached to the RFID semiconductor chip by welding.

9. The method of claim 1, wherein the solid wire is attached to the RFID semiconductor chip using a conductive adhesive.

10. The method of claim 1, wherein the solid wire is stitched into the fabric using an automatic sewing machine.

11. A method for making a Radio Frequency Identification (RFID) device on fabric, the method comprising:
    selecting a metal wire;
    stitching the metal wire into fabric to make an RFID antenna, wherein the metal wire includes at least two ends;
    applying a conductive adhesive to the at least two ends of the metal wire;
    attaching an RFID semiconductor chip to the fabric, wherein the RFID semiconductor chip includes at least two terminals and the RFID semiconductor chip is attached to the fabric with the at least two terminals corresponding to the at least two ends of the metal wire;
    curing the conductive adhesive; and
    encapsulating the metal wire and the RFID semiconductor chip.

12. The method of claim 11, wherein the metal wire is an insulated wire.

13. The method of claim 12, wherein the insulated wire is at least one of silver, copper, and aluminum.

14. The method of claim 11, wherein the metal wire is a non-insulated wire.

15. The method of claim 11, wherein the metal wire is stitched into the fabric in a design pattern.

16. The method of claim 11, wherein the metal wire is stitched into the fabric using an automatic sewing machine.

* * * * *